(12) United States Patent
Kwak (10) Patent No.: US 8,969,855 B2
(45) Date of Patent: Mar. 3, 2015

(54) ORGANIC LIGHT EMITTING DEVICE HAVING IMPROVED LIGHT EMITTING QUALITY

(75) Inventor: Won-Kyu Kwak, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 282 days.

(21) Appl. No.: 13/449,614

(22) Filed: Apr. 18, 2012

(65) Prior Publication Data

US 2013/0140589 A1 Jun. 6, 2013

(30) Foreign Application Priority Data

Dec. 1, 2011 (KR) .................... 10-2011-0127826

(51) Int. Cl.
*H01L 29/08* (2006.01)
*H01L 35/24* (2006.01)
*H01L 51/00* (2006.01)

(52) U.S. Cl.
USPC .................................... 257/40; 257/E51.022

(58) Field of Classification Search
CPC .................... H01L 51/0545; H01L 27/3211
USPC ............................................ 257/40, E51.022
See application file for complete search history.

(56) References Cited

U.S. PATENT DOCUMENTS

| 2009/0072726 A1* | 3/2009 | Murakami et al. | ............ 313/504 |
| 2009/0256168 A1* | 10/2009 | Taneda et al. | .................. 257/98 |

FOREIGN PATENT DOCUMENTS

| KR | 10-2002-0021451 A | 3/2002 |
| KR | 10-2003-0044658 A | 6/2003 |
| KR | 10-2005-0095500 A | 9/2005 |
| KR | 10-2008-0052799 A | 6/2008 |

* cited by examiner

*Primary Examiner* — Ha Tran T Nguyen
*Assistant Examiner* — Aaron Dehne
(74) *Attorney, Agent, or Firm* — Lee & Morse, P.C.

(57) ABSTRACT

An organic light emitting device includes, a base part, patterned first electrodes on the base part, conductive material layers spaced apart from the patterned first electrodes and between the first electrodes, pixel defining layers between the patterned first electrodes, the pixel defining layers overlapping only a portion of upper surfaces of the conductive material layers, light emitting layers on the first electrodes, and a second electrode on the light emitting layers.

36 Claims, 8 Drawing Sheets

ORGANIC LIGHT EMITTING DEVICE HAVING IMPROVED LIGHT EMITTING QUALITY

CROSS-REFERENCE TO RELATED PATENT APPLICATION

This application claims the benefit of Korean Patent Application No. 10-2011-0127826, filed on Dec. 1, 2011, in the Korean Intellectual Property Office, the disclosure of which is incorporated herein in its entirety by reference.

BACKGROUND

1. Field

The embodiments relate to an organic light emitting device having improved light emitting quality by reducing leakage current between pixels.

2. Description of the Related Art

In recent years, organic light emitting devices are being spotlighted in the field of display technology. The organic light emitting devices emitting light, which is generated when electrons and holes are coupled together and then diminish.

The organic light emitting device basically includes an electrode for injecting holes, an electrode for injecting electrons, and a light emitting layer. The organic light emitting device has a structure in which the light emitting layer is stacked between an anode, i.e. the electrode for injecting the holes, and a cathode, i.e. the electrode for injecting the electrons. In more detail, electrons are injected in a cathode of the organic light emitting device and holes are injected in an anode of the organic light emitting device. When the charges (holes and electrons) are moved in opposite directions by an external electric field, are coupled together in a light emitting layer, and diminish, light is emitted. The light emitting layer of the organic light emitting device includes an organic monomer or an organic polymer.

In recent years, as resolutions of displays are getting higher, resolutions of the pixels (ppi) have increased, and the interval between the pixels have gradually decreased. Further, in recent years, as efficiencies of light emitting materials for organic light emitting devices are increasing, a high brightness can be achieved with a low current and a low voltage, making it possible to lower power consumption. However, as light can be emitted by a small amount of current (due to a high efficiency of a light emitting material for an organic light emitting device) light may be emitted by a very small amount of current leaked from one pixel to another adjacent pixel. As a result, an adjacent pixel, which is not intended to emit light, often emits light.

The light emitted due to leakage currents is referred to as leakage emission light. If the leakage emission light is generated, a color mixture is generated and a color coordinate is changed. In addition, when the leakage emission due to a leakage current is generated in a low-brightness region, black brightness may increase.

In particular, a green light emitting material has a high efficiency. Thus, when a red pixel or a blue pixel adjacent to a green pixel is driven, the adjacent green pixel may emit light due to current leakage from the red or blue driven pixel.

The leakage emission light is one of the phenomena generated as an efficiency of a light emitting material and a resolution of a display increase. Accordingly, a method of lowering an efficiency of a light emitting material or lowering a resolution of a display device may be adopted to restrain a leakage emission light. However, a demand for low-power/high-resolution products has also increased in recent years.

As such, the problem of leakage emission light must be resolved without lowering the efficiency of a light emitting material or lowering the resolution of a display device.

Therefore, a technology for restraining a leakage emission light due to leakage currents, without lowering a resolution of a display unit using a high-efficiency light emitting material is needed.

SUMMARY

One or more embodiments may provide an organic light emitting device, including a base part, patterned first electrodes on the base part, conductive material layers spaced apart from the patterned first electrodes and between the first electrodes, pixel defining layers between the patterned first electrodes, the pixel defining layers overlapping only a portion of upper surfaces of the conductive material layers; light emitting layers on the first electrodes, and a second electrode on the light emitting layers.

The organic light emitting device may further include at least one first auxiliary light emitting layer between the light emitting layers and the first electrodes. The first auxiliary light emitting layer may include at least one of a hole injection layer and a hole transport layer.

The organic light emitting device may further include a second auxiliary light emitting layer between the light emitting layers and the second electrode. The second auxiliary light emitting layer may include at least one of an electron injection layer and an electron transport layer.

The first electrodes may be pixel electrodes. The first electrodes may be anodes and the second electrode may be a cathode. A material included in the conductive material layers and the first electrodes may be the same. The conductive material layers may include at least one of a transparent conductive oxide (TCO) layer and a metal layer. The transparent conductive oxide (TCO) layer may include at least one of an ITO layer, an IZO layer, and an AZO layer. The metal layer may include at least one of a silver (Ag) layer, a copper (Cu) layer, and an aluminum (Al) layer. The conductive material layers may include an ITO layer, a silver (Ag) layer, and an ITO layer, stacked in that order. The conductive material layers may be electrically connected to a terminal having a voltage lower than that of the first electrodes. The conductive material layers may be electrically connected to a cathode. The conductive material layers may be between the first electrodes and have a mesh-shape, a line-shape, or a comb-shape.

The light emitting layers may include a red light emitting layer, a green light emitting layer, and a blue light emitting layer, and the conductive material layers may surround the first electrodes corresponding to the green light emitting layer. The base part may include a substrate, a TFT layer, and a flat insulating layer. The base part may be a substrate.

One or more embodiments may provide a method of manufacturing an organic light emitting device, including forming patterns of first electrodes on a base part, forming conductive material layers between the patterned first electrodes, the conductive material layers being spaced apart from the first electrodes, forming pixel defining layers (PDLs) between the patterned first electrodes, the pixel defining layers overlapping only a portion of upper surfaces of the conductive material layers, forming light emitting layers on the first electrodes; and forming a second electrode on the light emitting layers.

The method may further include forming at least one first auxiliary light emitting layer after forming the pixel defining layers and before forming the light emitting layers. Forming the first auxiliary light emitting layer may include forming at least one of a hole injection layer and forming a hole transport layer. The method may further include forming at least one second auxiliary light emitting layer after forming the light emitting layers and before forming the second electrode. The second auxiliary light emitting layer may include forming at least one of an electron transport layer and an electron injection layer. Forming the conductive material layers and forming the patterns of the first electrodes may be performed simultaneously. Forming the conductive material layers may include forming at least one of a transparent conductive oxide (TCO) layer and a metal layer. The transparent conductive oxide (TCO) layer may include at least one of an ITO layer, an IZO layer, and an AZO layer. The metal layer may include at least one of a silver (Ag) layer, a copper (Cu) layer, and an aluminum (Al) layer. Forming the conductive material layers may include forming an ITO layer, forming a silver (Ag) layer, and forming an ITO layer, in that order. The conductive material layers may be formed in any one of a mesh-shape, a line-shape, and a comb-shape.

Forming the light emitting layers may include forming a red light emitting layer, forming a green light emitting layer, and forming a blue light emitting layer, the conductive material layers being formed to surrounding the first electrodes corresponding to the green light emitting layer. The first electrodes may be anodes and the second electrode may be a cathode, and forming the second electrode may include electrically connecting the conductive material layers to the second electrode. The method may further include electrically connecting the conductive material layers to the ground terminal during or after forming the conductive material layers, wherein the organic light emitting device includes a ground terminal, and the ground terminal has a voltage lower than that of the first electrodes.

An organic light emitting device may include a base part, first electrode patterns on the base part, conductive material layers spaced apart from the first electrode patterns and disposed between the first electrode patterns, pixel defining layers between the first electrode patterns, the pixel defining layers overlapping only a portion of upper surfaces of the conductive material layers, at least one first auxiliary light emitting layer on the first electrode patterns, the conductive material layers, and the pixel defining layers, light emitting layers on the first auxiliary light emitting layer, at least one second auxiliary light emitting layer on the light emitting layers, and a second electrode on the second auxiliary light emitting layer, wherein the light emitting layers are formed on the first electrode patterns. The first auxiliary light emitting layer may include at least one of a hole injection layer and a hole transport layer. The second auxiliary light emitting layer may include at least one of an electron injection layer and an electron transport layer.

One or more embodiments may provide a method of manufacturing an organic light emitting device, including forming first electrode patterns on a base part, forming conductive material layers between the first electrode patterns, the conductive material layers being spaced apart from the first electrode patterns, forming pixel defining layers between the first electrode patterns, the pixel defining layers overlapping only a portion of upper surfaces of the conductive material layers; forming at least one first auxiliary light emitting layer on the first electrode patterns, the conductive material layers, and the pixel defining layers, forming light emitting layers on the first auxiliary light emitting layer, forming at least one second auxiliary light emitting layer on the light emitting layers, and forming a second electrode on the second auxiliary light emitting layer, wherein the light emitting layers are formed on the first electrode patterns. Forming the first auxiliary light emitting layer may include at least one of forming a hole injection layer; and forming a hole transport layer. Forming the second auxiliary light emitting layer may include at least one of forming an electron injection layer, and forming an electron transport layer.

The first electrodes may be anodes and the second electrode may be a cathode, and forming the second electrode includes electrically connecting the conductive material layers to the second electrode. The method may further include electrically connecting the conductive material layers to the ground terminal during or after forming the conductive material layers, wherein the organic light emitting device includes a ground terminal, and the ground terminal has a voltage lower than that of the first electrodes.

BRIEF DESCRIPTION OF THE DRAWINGS

The above and other objects, features and advantages of the embodiments will be more apparent from the following detailed description taken in conjunction with the accompanying drawings, in which.

DETAILED DESCRIPTION

Hereinafter, an exemplary embodiment will be described in more detail with reference to the accompanying drawings. However, the scope of the embodiments is not limited to the below-described embodiments and the drawings.

For reference, the elements and their shapes may be drawn or exaggerated in the drawings to facilitate an understanding of the embodiments. In the drawings, the same reference numerals denote the same elements.

Further, when it is described that a layer or element is located "on" another layer or element, the layer or element may not only directly contact the other layer or element, but also a third layer or element may be interposed therebetween.

Figure 1:
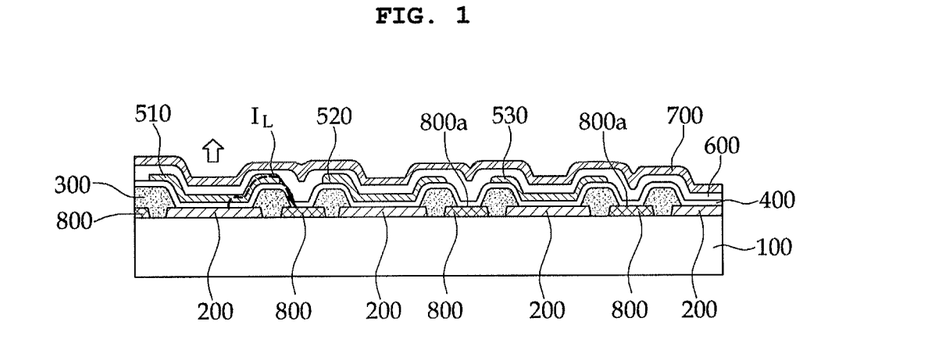
FIG. 1 diagrammatically illustrates an example of an organic light emitting device according to the embodiments.

FIG. 1 diagrammatically illustrates an organic light emitting device according to the embodiments. The organic light emitting device is used in a display panel. Thus, the device is sometimes referred to as an organic light emitting display device. However, the term "organic light emitting device" is used herein.

The organic light emitting device of FIG. 1 may include a base part 100, first electrodes 200 patterned on the base part 100, conductive material layers 800 spaced apart from the patterned first electrodes 200 and formed between the first electrodes 200, pixel defining layers 300 between the patterned first electrodes 200, light emitting layers 510, 520, and 530 formed on the first electrodes 200, and a second electrode 700 formed on the light emitting layers 510, 520, and 530.

The organic light emitting device illustrated in FIG. 1 may include a first auxiliary light emitting layer 400 formed between the light emitting layers 510, 520, and 530 and the first electrodes 200 and a second auxiliary light emitting layer 600 formed between the light emitting layers 510, 520, and 530 and the second electrode 700.

The light emitting layers 510, 520, and 530, the first auxiliary light emitting layer 400, and the second auxiliary light emitting layer 600 may correspond to organic layers.

Referring to FIG. 1, the conductive material layers 800 may be formed between the first electrodes 200, e.g., the first electrodes 200 and the conductive material layers 800 may alternate. The pixel defining layers 300 may be formed such that a portion of upper surfaces 800a of the conductive material layers 800 are open, i.e., not covered by the pixel defining layers 300. For example, the pixel defining layers 300 may only partially overlap the conductive material layers 800. The pixel defining layers 300 may be formed between the first electrodes 200 and the conductive material layers 800, e.g., one pixel defining layer 300 may be between a first electrode 200 and an adjacent conductive material layer 800. The pixel defining layers (PDL) 300 may cover only a portion of an upper surface of the first electrodes 200 and the conductive material layers 800. A remaining portion of the upper surface of the first electrodes 200 and the conductive material layers 800 may be open, i.e., not covered by the pixel defining layers 300.

The first electrodes 200 may be defined in units of pixels by the pixel defining layers 300. For example, the pixel defining layers 300 adjacent each of the first electrodes 200 may define a pixel. The light emitting layers 510, 520, and 530 may be formed on the first electrodes 200, which may be defined in units of pixels by the pixel defining layers 300.

The light emitting layers 510, 520, and 530 may include a red light emitting layer 510, a green light emitting layer 520, and a blue light emitting layer 530. The light emitting layers 510, 520, and 530 may include a red light emitting material, a green light emitting material, and a blue light emitting material, respectively. The light emitting materials may be organic materials. Any suitable light emitting materials known in the art may be used for the light emitting layers 510, 520, and 530.

It can be seen from FIG. 1 that the first auxiliary light emitting layer 400 may be formed on an entire upper surface of the first electrodes 200, the conductive material layers 800, and the pixel defining layers 300. The first auxiliary light emitting layer 400 may be a hole injection layer and/or a hole transport layer. The first auxiliary light emitting layer 400 may include two layers, and may include both a hole injection layer and a hole transport layer separately. It is illustrated in the embodiment of FIG. 1 that the first auxiliary light emitting layer 400 is a hole injection and transport layer having both a hole injection function and a hole transport function.

The second auxiliary light emitting layer 600 may be an electron injection layer and/or an electron transport layer. The second auxiliary light emitting layer 600 may include two layers, and may include both an electron injection layer and an electron transport layer separately. It is illustrated in the embodiment of FIG. 1 that the second auxiliary light emitting layer 600 is an electron transport layer.

In the embodiment of FIG. 1, the first electrodes 200 may be anodes, functioning as pixel electrodes, and the second electrode 700 may be a cathode, functioning as a common electrode. The first electrodes 200, functioning as anodes, may be formed on the base part 100 in a patterned form.

The first electrodes 200 may supply electric charges to the red light emitting layer 510, the green light emitting layer 520, and the blue light emitting layer 530. The red light emitting layer 510, the green light emitting layer 520, and the blue light emitting layer 530 formed on the first electrodes 200, may become a red pixel, a green pixel, and a blue pixel, respectively.

The second electrode 700, i.e. the cathode, may be formed on an entire upper surface of the second auxiliary light emitting layer 600.

Figure 2A:
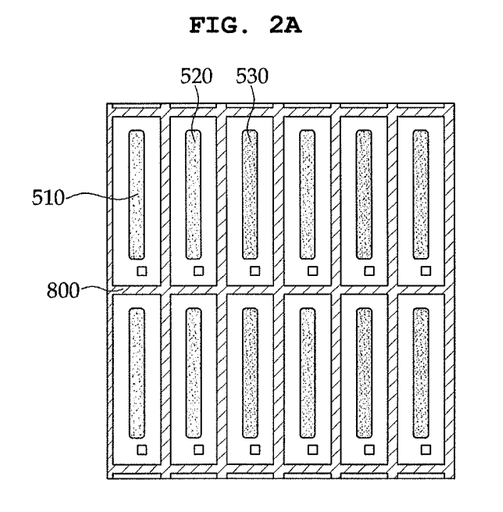
FIGS. 2A to 2D diagrammatically illustrate planar dispositions of conductive material layers 800 in the organic light emitting device according to the embodiments.
Figure 2B:
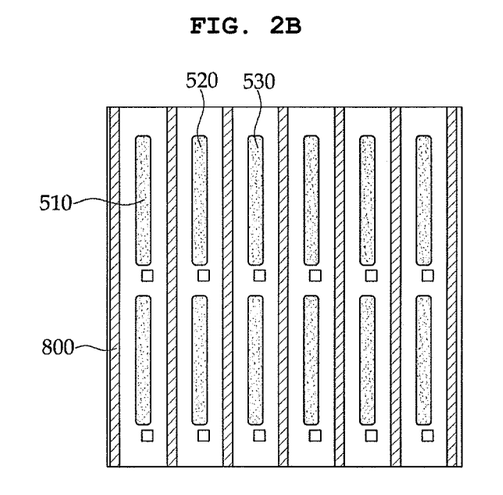

FIGS. 2A to 2B illustrate exemplary planar dispositions of conductive material layers 800 in the organic light emitting device according to embodiments.

Figure 2C:
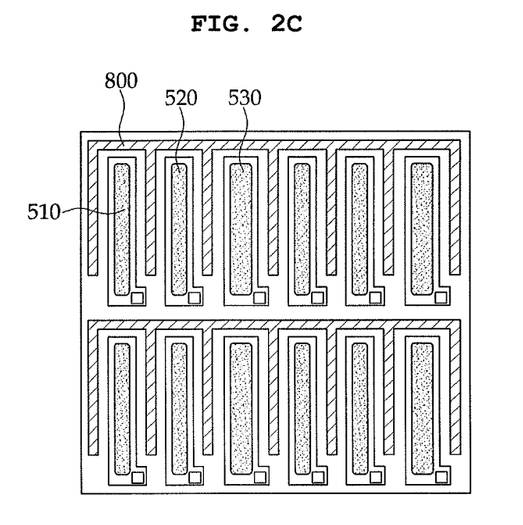

According to some embodiments, as illustrated in FIG. 2A, the conductive material layers 800 may form a mesh-like configuration between the patterned first electrodes 200. For example, the conductive material layers 800 may surround the periphery of each of the first electrodes. According to some embodiments, as illustrated in FIG. 2B, the conductive material layers 800 may include line-shaped or linear portions which extend parallel to one another. According to some embodiments, as illustrated in FIG. 2C, the conductive material layers 800 may be comb-shaped, including a horizontal base portion, and vertical extensions that depend from the base portion between each of the patterned first electrodes 200.

Figure 2D:
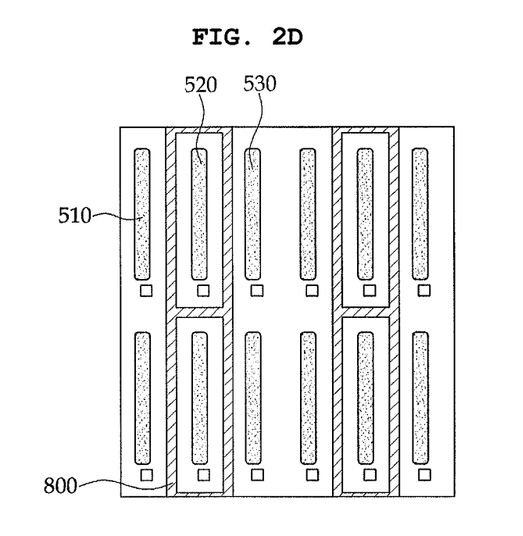

As illustrated in FIG. 2D, the conductive material layers 800 may be formed as traps, e.g., any suitable shape for surrounding a specific type, i.e., selected ones, of the light emitting layers. For example, the conductive material layers 800 may surround the first electrodes 200 corresponding to the green light emitting layer 520. A green light emitting material has excellent efficiency. As such, leakage of emission light may be mainly generated in the green light emitting layer. Accordingly, the conductive material layers 800 may surround the first electrodes 200 corresponding to the green light emitting layer 520.

As illustrated in FIG. 1, the conductive material layers 800 may be formed between the first electrodes 200, and may be spaced apart from the first electrodes 200. For example, each conductive material layer 800 may separate two adjacent first electrodes 200. The conductive material layers 800 may be electrically separated from the first electrodes 200. Accordingly, the pixel defining layers 300 may also be formed between the conductive material layers 800 and the first electrodes 200. The pixel defining layers 300 may be formed of an insulating material. Any suitable material known in the art may be used for the pixel defining layers 300. The pixel defining layer may also be referred to as a separation wall or a pixel definition line (PDL). The phrase "pixel defining layer" is used herein.

The pixel defining layers 300 may be formed between the first electrodes 200 to define the first electrodes 200 in units of pixels. For example, the pixel defining layers 300 adjacent each of the first electrodes 200 may define a pixel. The pixel defining layers 300 may also be formed between the first electrodes 200 and the conductive material layers 800. The pixel defining layers 300 may not completely cover, i.e., may only partially overlap, the conductive material layers 800. For example, the pixel defining layers 300 may cover only a portion of the upper surface 800a of the first electrodes 200 and the conductive material layers 800. A remaining portion of the upper surface of the first electrodes 200 and the conductive material layers 800 may be open, i.e., not covered by the pixel defining layers 300.

The first auxiliary light emitting layer 400 may be disposed on the conductive material layer 800. The first auxiliary light emitting layer 400 may be formed on an entire upper surface of the first electrodes 200, the conductive material layers 800, and the pixel defining layers 300.

As the conductive material layers 800 may be formed in the above-described way, the leakage currents IL generated in one light emitting layer 510 may not flow into an adjacent light emitting layer 520 but gather in the conductive material layers 800. Accordingly, the leakage currents IL may be prevented from flowing into the adjacent light emitting layer 520.

The conductive material layers 800 may be electrically connected to a terminal having a voltage lower than that of the first electrodes 200. As an example, the conductive material layers 800 may be electrically connected to the cathode 700. The conductive material layers 800 may also be connected to a separate terminal, and may be connected to a ground terminal. As the conductive material layers 800 may be connected to the cathode or the ground terminal, the leakage currents IL having gathered in the conductive material layers 800 may be easily discharged.

As a result, leakage emission light may be prevented from being generated in the light emitting layer 520 adjacent to the light emitting layer 510 where the leakage currents IL are generated.

Figure 3A:
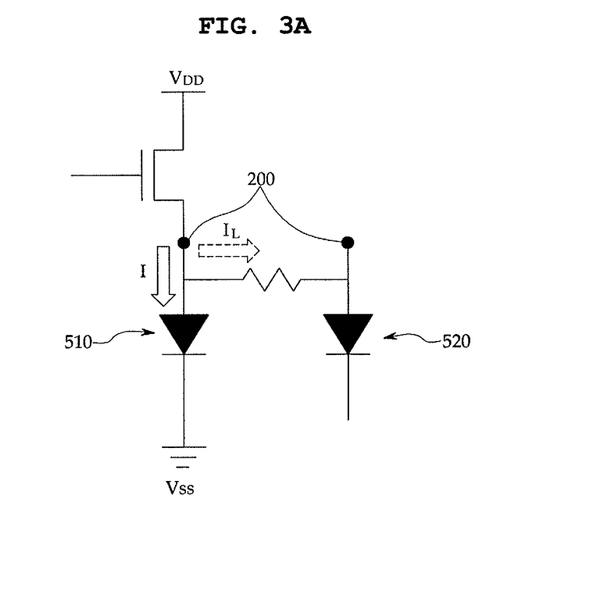
FIG. 3A is a circuit diagram illustrating a flow of a leakage current in a conventional organic light emitting device.
Figure 3B:
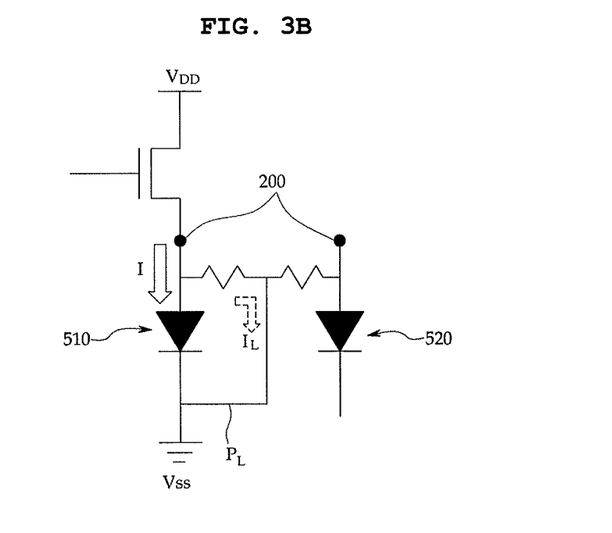
FIG. 3B is a circuit diagram illustrating a flow of a leakage current in the organic light emitting device according to the embodiments, wherein a current is not leaked to an adjacent pixel.

In this regard, FIG. 3A illustrates a flow of a leakage current in a conventional organic light emitting device. FIG. 3B illustrates a flow of a leakage current in the organic light emitting device according to the embodiments.

It can be seen from FIG. 3A that the leakage currents IL generated in the red light emitting layer 510 flow into the adjacent green light emitting layer 520. Even when the leakage currents IL constitute a small amount, they may cause the green light emitting layer 520 to emit light.

As can be seen from FIG. 3B before the leakage currents IL generated in the red light emitting layer 510 flow into the green light emitting layer 520, they flow through a path PL (leakage path) that is newly formed by the conductive material layer 800. When the conductive material layer 800 is electrically connected to the cathode, the leakage currents will flow to the cathode, and when the conductive material layer 800 is connected to a separate ground terminal, the leakage currents will flow to the ground line. As a result, leakage emission light is prevented from being generated in the light emitting layer 520 adjacent to the light emitting layer 510 where the leakage currents are generated.

According to some embodiments, the conductive material layers 800 may be formed of a material that is the same as that of the first electrodes 200. According to some embodiments, the conductive material layers 800 may be formed of a material different from that of the first electrodes 200.

The conductive material layers 800 may be a single layer or a plurality of stacked layers. The conductive material layers 800 may include at least one of a transparent conductive oxide (TCO) layer and a metal layer.

The transparent conductive oxide (TCO) layer may include a suitable material generally used in the art. For example, the transparent conductive oxide (TCO) layer may include at least one selected from an ITO layer, an IZO layer, and an AZO layer.

The metal layer also may include a suitable material generally used in the art. For example, the metal layer may include at least one material selected from a silver (Ag) layer, a copper (Cu) layer, and an aluminum (Al) layer.

It is apparent that the conductive material layers 800 may be formed of a material other than the above-listed materials.

The conductive material layers 800 may include, for example, a layer including ITO, which is widely used for a transparent electrode material, and a layer including silver (Ag), which has an excellent conductivity. The conductive material layers 800 may include, for example, a stacked structure in which an ITO layer, a silver (Ag) layer, and an ITO layer are sequentially stacked.

According to some embodiments, the base part 100 may include a substrate, a TFT layer, and a flat insulation layer. The base part 100 may include only a substrate. Accordingly, the base part 100 may, according to some embodiments, be a substrate.

For simplicity, FIG. 1 does not illustrate all of the individual elements of the base part 100.

FIGS. 4A to 4H diagrammatically illustrate stages in a process of manufacturing an organic light emitting device according to an embodiment.

Figure 4A:
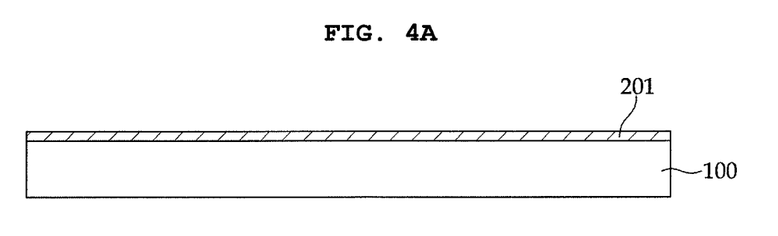
FIGS. 4A to 4H diagrammatically illustrate an example of stages in a process of manufacturing an organic light emitting device according to the embodiments.

A base part 100 may be prepared first, and a material 201 for forming first electrodes and conductive material layers may be applied to the base part 100 (FIG. 4A).

According to some embodiments, the process of preparing the base part 100 may include a step of preparing a substrate, a step of forming a TFT layer, and a step of forming a flat insulation layer. In the present embodiment, a description of the entire process to prepare the base part 100 will be omitted. Further, according to the present embodiment, only the substrate may be a base part.

The method of applying a material 201 for forming the first electrodes and the conductive material layers may be any suitable method generally used in the art. An example of such a method may include sputtering.

According to some embodiments, the first electrodes 200 and the conductive material layers 800 may be formed of a same material, as will be described with reference to FIGS. 4A to 4H. Accordingly, a material for forming both the first electrodes 200 and the conductive material layers 800 may be applied to the base part 100 in a whole, e.g., in one step.

The first electrodes 200 and the conductive material layers 800 may include at least one of a transparent conductive oxide (TCO) layer and a metal layer. Accordingly, in the process of applying the material 201 for forming the first electrodes 200 and the conductive material layers 800, at least one of a step of forming a transparent conductive oxide (TCO) layer and a step of forming a metal layer may be included. Here, the transparent conductive oxide (TCO) layer may include at least one of an ITO layer, an IZO layer, and an AZO layer. The metal layer may include at least one of a silver (Ag) layer, a copper (Cu) layer, and an aluminum layer (Al).

Meanwhile, the first electrodes 200 and the conductive material layers 800 may include an ITO layer, a silver (Ag) layer, and an ITO layer stacked, in that order. In order to form the first electrodes 200 and the conductive material layers 800, a step of forming an ITO layer, a step of forming a silver (Ag) layer, and a step of forming an ITO layer may be sequentially performed.

Figure 4B:
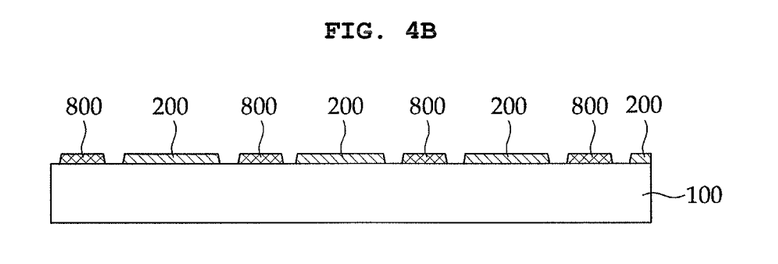

The first electrodes 200 and the conductive material layers 800 may be formed by patterning the material 201 for forming the first electrodes and the conductive material layers, which are applied on the base part 100 (FIG. 4B). Any suitable method patterning method generally known in the art may be used.

The first electrodes 200 and the conductive material layers 800 may be patterned simultaneously. The conductive material layers 800 may be formed between the patterns of the first electrodes 200 and may be spaced apart from the patterns of the first electrodes 200.

According to some embodiments, when the conductive material layers 800 are patterned, the conductive material layers 800 may be formed between the first electrodes 200 in any one of a mesh, line, or comb-shape, as described above. According to some embodiments, when the conductive material layers 800 are patterned, the conductive material layers 800 may surround only the first electrodes 200 corresponding to the green light emitting layer.

Figure 4C:
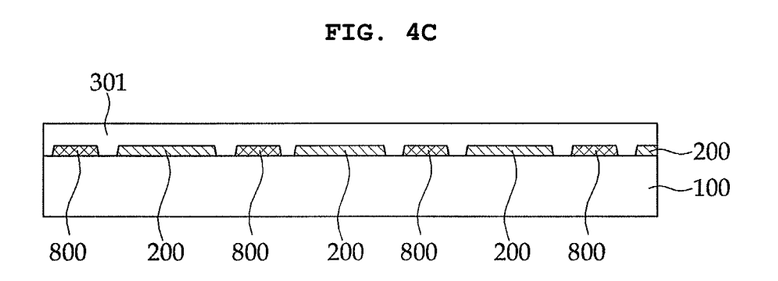

A pixel defining layer forming material 301 may be applied on the patterned first electrodes 200 and conductive material layers 800 (FIG. 4C). The pixel defining layer forming material 301 may be an electrically insulating material. The pixel defining layer forming material 301 may be formed from any suitable material generally known in the art.

Figure 4D:
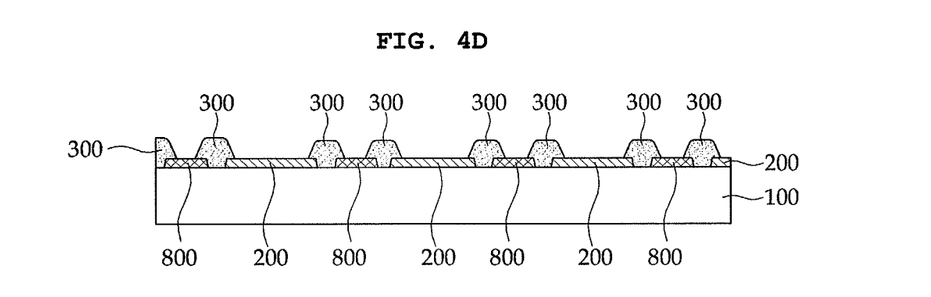

The pixel defining layers 300 may be formed by patterning the pixel defining layer forming material 301 (FIG. 4D). Any suitable patterning method generally known in the art may be used. The pixel defining layers 300 may be formed between the first electrodes 200 such that upper portions of the conductive material layers 800 may be open. For example, the pixel defining layers 300 may only partially overlap the conductive material layers 800.

As shown in FIG. 4D, the pixel defining layers 300 may be formed between the first electrodes 200 and the conductive material layers 800. Upper portions of the first electrodes 200 and upper portions of the conductive material layers 800 may be partially open. For example, the pixel defining layers 300 may only partially overlap the conductive material layers 800 and the first electrodes 200. The pixel defining layers 300 may be formed only between the first electrodes 200 when there is no conductive material layer 800 between the first electrodes 200. For example, each of the pixel defining layers 300 may contact two adjacent first electrodes 200 when a conductive material layer 800 is not disposed between the two adjacent first electrodes 200.

Figure 4E:
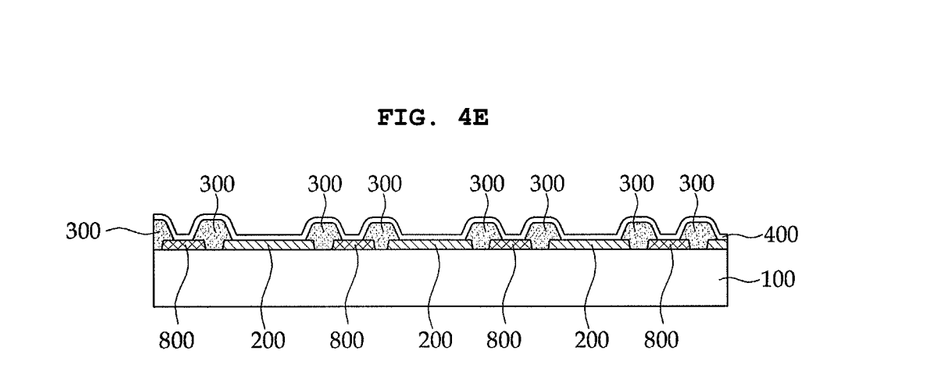

A first auxiliary light emitting layer 400 may be formed before the light emitting layers 510, 520, and 530 are formed (FIG. 4E). As can be seen in FIG. 4E, the first auxiliary light emitting layer 400 may be formed on a surface, e.g., an entire surface, of the first electrodes 200, the conductive material layers 800, and the pixel defining layers 300. The first auxiliary light emitting layer 400 may be any one of a hole injection layer and a hole transport layer and may include both a hole injection layer and a hole transport layer.

Figure 4F:
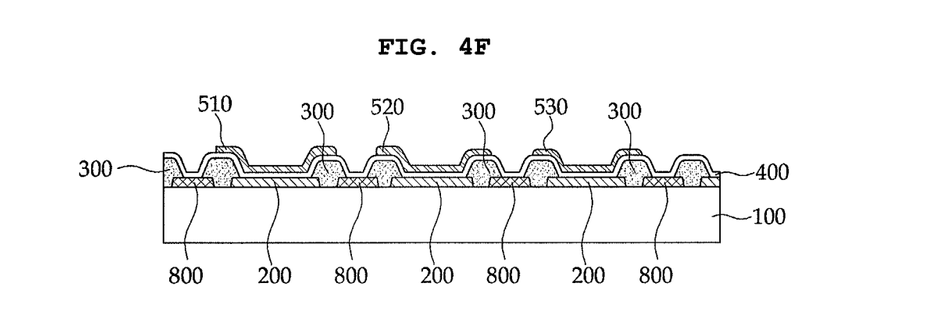

FIG. 4E illustrates a hole injection and a hole transport layer, having both a hole injection function and a hole transport function, as the auxiliary light emitting layer 400. The step of forming the first auxiliary light emitting layer 400 may include at least one of a step of forming a hole injection layer and a hole transport layer, and may also include both steps. For example, the first auxiliary light emitting layer 400 may include two layers, the hole injection layer and the hole transport layer. The hole injection layer may be formed before the hole transport layer is formed. Thereafter, light emitting layers 510, 520, and 530 may be formed on the first auxiliary light emitting layer 400 (FIG. 4F).

The light emitting layers 510, 520, and 530 may be disposed on the first electrodes 200 defined in units of pixels by the pixel defining layers 300. The light emitting layers may include the red light emitting layer 510, the green light emitting layer 520, and the blue light emitting layer 530. Any suitable method of preparing light emitting layers generally known in the art may be used to prepare the light emitting layers 510, 520, and 530. Therefore, a specific description of preparing the light emitting layers is omitted.

Figure 4G:
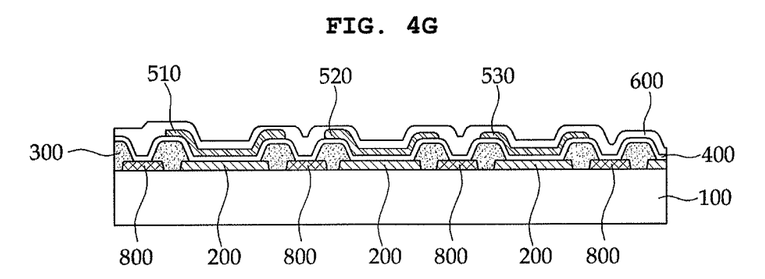

According to the present embodiment, a second auxiliary light emitting layer 600 may be formed after the light emitting layers 510, 520, and 530 are formed and before the second electrode 700 is formed (FIG. 4G).

The second auxiliary light emitting layer 600 may include at least one of an electron injection layer and an electron transport layer. Accordingly, the step of forming the second auxiliary light emitting layer 600 may include at least one of a step of forming a hole injection layer and a step of forming a hole transport layer. According to an embodiment, the second auxiliary light emitting layer 600 may be an electron transport layer. Accordingly, FIG. 4G illustrates that an electron transport layer is formed as the second auxiliary light emitting layer 600. However, the second auxiliary light emitting layer 600 may include two layers, and may include both an electron injection layer and an electron transport layer separately.

Figure 4H:
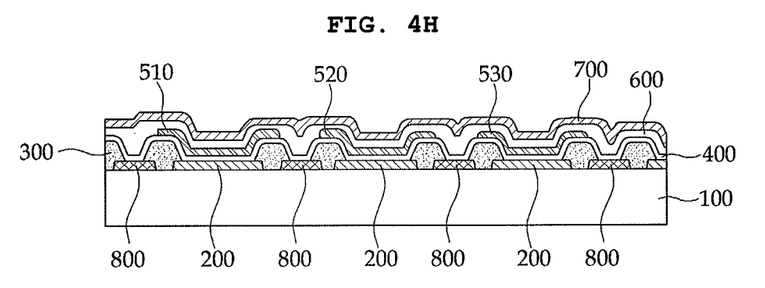

Next, a second electrode 700 may be formed on the second auxiliary light emitting layer 600 (FIG. 4H). The organic light emitting device according to the embodiments may be manufactured through the above-described process.

Figure 5A:
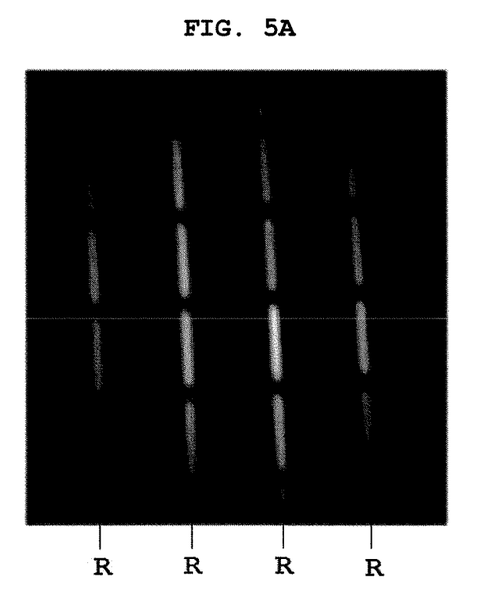
FIGS. 5A and 5B illustrate a state where leakage emission light is not generated by preventing a leakage current in the organic light emitting device according to the embodiments.
Figure 5B:
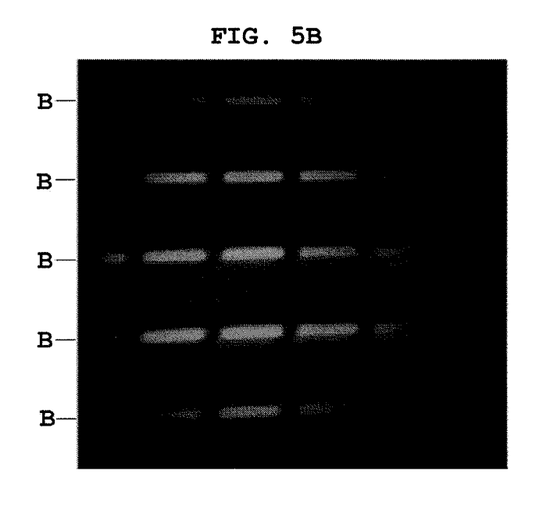

FIGS. 5A and 5B show emission of light of the organic light emitting device manufactured according to one or more embodiments. As shown in FIG. 5A that when red pixels R are turned on, only the red pixels R emit light. As shown in FIG. 5B, when blue pixels B are turned on, only the blue pixels B emit light. In this way, the organic light emitting device according to the embodiments may prevent generation of leakage currents without causing leakage emission light.

The organic light emitting device, according to the embodiments, may prevent a leakage current that flows from one pixel to an adjacent pixel of a light emitting part (which is generated when driving a pixel). Accordingly, an undesired emission of light in the adjacent pixel may be prevented. As a result, colors can be accurately realized, and light emitting quality can be improved. Leakage emission light due to a leakage current can be restrained, even in an organic light emitting device of a high resolution which uses a light emitting material of a high efficiency. Accordingly, the organic light emitting device according to the embodiments, can improve color realization and light emitting quality while satisfying a recent increased demand for products of low power consumption and high resolution.

What is claimed is:

1. An organic light emitting device, comprising:
   a base part;
   patterned first electrodes on the base part;
   conductive material layers spaced apart from the patterned first electrodes and between the first electrodes;
   pixel defining layers between the patterned first electrodes, the pixel defining layers overlapping only a portion of upper surfaces of the conductive material layers;
   light emitting layers on the first electrodes;
   at least one first auxiliary light emitting layer on the patterned first electrodes, the conductive material layers, and the pixel defining layers; and
   a second electrode on the light emitting layers, the conductive material layers being insulated from the second electrode, wherein the at least one first auxiliary light emitting layer is between the conductive material layers and the second electrode, and wherein the at least one first auxiliary light emitting layer directly contacts the conductive material layers.

2. The organic light emitting device as claimed in claim 1, wherein the first auxiliary light emitting layer includes at least one of a hole injection layer or a hole transport layer.

3. The organic light emitting device as claimed in claim 1, further comprising a second auxiliary light emitting layer between the light emitting layers and the second electrode and between the conductive material layers and the second electrode.

4. The organic light emitting device as claimed in claim 3, wherein the second auxiliary light emitting layer includes at least one of an electron injection layer and an electron transport layer.

5. The organic light emitting device as claimed in claim 1, wherein the first electrodes are pixel electrodes.

6. The organic light emitting device as claimed in claim 1, wherein the first electrodes are anodes and the second electrode is a cathode.

7. The organic light emitting device as claimed in claim 1, wherein a material included in the conductive material layers and the first electrodes is the same.

8. The organic light emitting device as claimed in claim 1, wherein the conductive material layers include at least one of a transparent conductive oxide (TCO) layer and a metal layer.

9. The organic light emitting device as claimed in claim 8, wherein the transparent conductive oxide (TCO) layer includes at least one of an ITO layer, an IZO layer, and an AZO layer.

10. The organic light emitting device as claimed in claim 8, wherein the metal layer includes at least one of a silver (Ag) layer, a copper (Cu) layer, and an aluminum (Al) layer.

11. The organic light emitting device as claimed in claim 1, wherein the conductive material layers include an ITO layer, a silver (Ag) layer, and an ITO layer, stacked in that order.

12. The organic light emitting device as claimed in claim 1, wherein the conductive material layers are electrically connected to a terminal having a voltage lower than that of the first electrodes.

13. The organic light emitting device as claimed in claim 1, wherein the conductive material layers are electrically connected to a cathode.

14. The organic light emitting device as claimed in claim 1, wherein the conductive material layers are between the first electrodes and have a mesh-shape, a line-shape, or a comb-shape.

15. The organic light emitting device as claimed in claim 1, wherein the light emitting layers include a red light emitting layer, a green light emitting layer, and a blue light emitting layer, and the conductive material layers surround the first electrodes corresponding to the green light emitting layer.

16. The organic light emitting device as claimed in claim 1, wherein the base part includes a substrate, a TFT layer, and a flat insulating layer.

17. The organic light emitting device as claimed in claim 1, wherein the base part is a substrate.

18. A method of manufacturing an organic light emitting device, the method including:
forming patterns of first electrodes on a base part;
forming conductive material layers between the patterned first electrodes, the conductive material layers being spaced apart from the first electrodes;
forming pixel defining layers (PDLs) between the patterned first electrodes, the pixel defining layers overlapping only a portion of upper surfaces of the conductive material layers;
forming light emitting layers on the first electrodes;
forming at least one first auxiliary light emitting layer on the patterned first electrodes, the conductive material layers, and the pixel defining layers; and
forming a second electrode on the light emitting layers, the conductive material layers being insulated from the second electrode, wherein the at least one first auxiliary light emitting layer is formed between the conductive material layers and the second electrode, and wherein the at least one first auxiliary light emitting layer directly contacts the conductive material layers.

19. The method as claimed in claim 18, wherein forming the at least one first auxiliary light emitting layer is performed after forming the pixel defining layers and before forming the light emitting layers.

20. The method as claimed in claim 19, wherein forming the first auxiliary light emitting layer includes forming at least one of a hole injection layer or a hole transport layer.

21. The method as claimed in claim 18, further comprising forming at least one second auxiliary light emitting layer after forming the light emitting layers, after forming the conductive material layers, and before forming the second electrode, the second auxiliary light emitting layer being between the light emitting layers and the second electrode and between the conductive material layers and the second electrode.

22. The method as claimed in claim 21, wherein forming the second auxiliary light emitting layer includes forming at least one of an electron transport layer and an electron injection layer.

23. The method as claimed in claim 18, wherein forming the conductive material layers and forming the patterns of the first electrodes are performed simultaneously.

24. The method as claimed in claim 18, wherein forming the conductive material layers includes forming at least one of a transparent conductive oxide (TCO) layer and a metal layer.

25. The method as claimed in claim 24, wherein the transparent conductive oxide (TCO) layer includes at least one of an ITO layer, an IZO layer, and an AZO layer.

26. The method as claimed in claim 24, wherein the metal layer includes at least one of a silver (Ag) layer, a copper (Cu) layer, and an aluminum (Al) layer.

27. The method as claimed in claim 18, wherein forming the conductive material layers includes: forming an ITO layer; forming a silver (Ag) layer; and forming an ITO layer, in that order.

28. The method as claimed in claim 18, wherein the conductive material layers are formed in any one of a mesh-shape, a line-shape, and a comb-shape.

29. The method as claimed in claim 18, wherein
forming the light emitting layers includes forming a red light emitting layer, forming a green light emitting layer, and forming a blue light emitting layer, and
the conductive material layers are formed to surround the first electrodes corresponding to the green light emitting layer.

30. The method as claimed in claim 18, wherein
the first electrodes are anodes and the second electrode is a cathode, and
forming the second electrode includes electrically connecting the conductive material layers to the second electrode.

31. The method as claimed in claim 18, further comprising:
electrically connecting the conductive material layers to the ground terminal during or after forming the conductive material layers,
wherein the organic light emitting device includes a ground terminal, and the ground terminal has a voltage lower than that of the first electrodes.

32. An organic light emitting device, comprising:
a base part;
first electrode patterns on the base part;
conductive material layers spaced apart from the first electrode patterns and disposed between the first electrode patterns;
pixel defining layers between the first electrode patterns, the pixel defining layers overlapping only a portion of upper surfaces of the conductive material layers;

at least one first auxiliary light emitting layer on the first electrode patterns, the conductive material layers, and the pixel defining layers, the first auxiliary light emitting layer overlapping the conductive material layers;

light emitting layers on the first auxiliary light emitting layer;

at least one second auxiliary light emitting layer on the light emitting layers; and a second electrode on the second auxiliary light emitting layer, wherein the light emitting layers are formed on the first electrode patterns and wherein the at least one first auxiliary light emitting layer directly contacts the conductive material layers.

33. A method of manufacturing an organic light emitting device, the method including:

forming first electrode patterns on a base part;

forming conductive material layers between the first electrode patterns, the conductive material layers being spaced apart from the first electrode patterns;

forming pixel defining layers between the first electrode patterns, the pixel defining layers overlapping only a portion of upper surfaces of the conductive material layers;

forming at least one first auxiliary light emitting layer on the first electrode patterns, the conductive material layers, and the pixel defining layers, the first auxiliary light emitting layer overlaps the conductive material layers;

forming light emitting layers on the first auxiliary light emitting layer;

forming at least one second auxiliary light emitting layer on the light emitting layers; and forming a second electrode on the second auxiliary light emitting layer, wherein the light emitting layers are formed on the first electrode patterns and wherein the at least one first auxiliary light emitting layer directly contacts the conductive material layers.

34. The method as claimed in claim 33, wherein the first electrodes are anodes and the second electrode is a cathode, and forming the second electrode includes electrically connecting the conductive material layers to the second electrode.

35. The method as claimed in claim 33, further comprising electrically connecting the conductive material layers to the ground terminal during or after forming the conductive material layers, wherein the organic light emitting device includes a ground terminal, and the ground terminal has a voltage lower than that of the first electrodes.

36. The organic light emitting device as claimed in claim 32, wherein the at least one first auxiliary light emitting layer is between the conductive material layers and the second electrode.

* * * * *